United States Patent
Fuergut et al.

(10) Patent No.: US 7,622,733 B2
(45) Date of Patent: Nov. 24, 2009

(54) SEMICONDUCTOR STRUCTURE WITH A PLASTIC HOUSING AND SEPARABLE CARRIER PLATE

(75) Inventors: Edward Fuergut, Dasing (DE); Thomas Kalin, Treffen (AT); Holger Woerner, Regensburg (DE); Carsten Von Koblinski, Villach (AT)

(73) Assignee: Infineon Technologies AG, Neubiberg (DE)

( * ) Notice: Subject to any disclaimer, the term of this patent is extended or adjusted under 35 U.S.C. 154(b) by 34 days.

(21) Appl. No.: 11/685,005

(22) Filed: Mar. 12, 2007

(65) Prior Publication Data

US 2007/0145555 A1 Jun. 28, 2007

Related U.S. Application Data

(60) Division of application No. 11/341,895, filed on Jan. 30, 2006, now Pat. No. 7,202,107, which is a continuation of application No. PCT/DE2004/001667, filed on Jul. 27, 2004.

(30) Foreign Application Priority Data

Jul. 28, 2003 (DE) .............................. 103 34 576

(51) Int. Cl.
- *H01L 35/24* (2006.01)
- *H01L 51/00* (2006.01)
- *H01L 23/48* (2006.01)
- *H01L 23/52* (2006.01)
- *H01L 29/40* (2006.01)

(52) U.S. Cl. .................... 257/40; 257/758; 257/737; 257/E21.37; 257/E29.273; 257/E51.006

(58) Field of Classification Search .......... 257/E23.001, 257/E23.116, E23.123, E23.124, E23.125, 257/E23.129, 40, 758, 737, 676, 706, 707, 257/778, E21.37, E29.273, E29.183, E51.006, 257/E51.001, E51.004

See application file for complete search history.

(56) References Cited

U.S. PATENT DOCUMENTS

| | | | |
|---|---|---|---|
| 4,395,451 A * | 7/1983 | Althouse | 257/E21.214 |
| 6,002,592 A * | 12/1999 | Nakamura et al. | 361/760 |
| 6,271,469 B1 | 8/2001 | Ma et al. | |
| 6,429,508 B1 | 8/2002 | Gang | |
| 6,528,354 B1 | 3/2003 | Hosaka | |
| 6,534,338 B1 | 3/2003 | Schoonejongen et al. | |
| 6,627,997 B1 * | 9/2003 | Eguchi et al. | 257/777 |
| 6,683,379 B2 * | 1/2004 | Haji et al. | 257/729 |
| 6,746,897 B2 | 6/2004 | Fukutomi et al. | |

(Continued)

FOREIGN PATENT DOCUMENTS

DE 19932269 A1 1/2000

(Continued)

*Primary Examiner*—Walter L Lindsay, Jr.
(74) *Attorney, Agent, or Firm*—Edell, Shapiro & Finnan, LLC

(57) ABSTRACT

A semiconductor structure includes: a carrier plate; a thermosensitive adhesive coupled to a top surface of the carrier plate, which is removable from the carrier plate at a predetermined, defined temperature at which the thermosensitive adhesive loses its adhesive action; semiconductor chips having active top surfaces and back surfaces, where the active top surfaces include contact surfaces disposed on the thermosensitive adhesive; and a plastic embedding compound on the carrier plate, in which the semiconductor chips are embedded.

18 Claims, 1 Drawing Sheet

U.S. PATENT DOCUMENTS

| | | | |
|---|---|---|---|
| 6,780,668 | B1 | 8/2004 | Tsukahara et al. |
| 6,784,541 | B2 * | 8/2004 | Eguchi et al. ............... 257/723 |
| 6,794,273 | B2 * | 9/2004 | Saito et al. .................. 438/462 |
| 6,835,603 | B2 * | 12/2004 | Acklin et al. ............... 438/122 |
| 7,018,866 | B2 | 3/2006 | Sugaya et al. |
| 7,134,198 | B2 * | 11/2006 | Nakatani et al. ............. 29/841 |
| 7,151,014 | B2 * | 12/2006 | Manepalli et al. ........... 438/127 |
| 7,153,725 | B2 * | 12/2006 | Wang et al. ................. 438/122 |
| 7,163,843 | B2 * | 1/2007 | Kiendl et al. ............... 438/114 |
| 2002/0025607 | A1 | 2/2002 | Danno et al. |
| 2002/0159242 | A1 * | 10/2002 | Nakatani et al. ............. 361/760 |
| 2003/0094695 | A1 * | 5/2003 | Hedler et al. ............... 257/737 |
| 2003/0203192 | A1 * | 10/2003 | Kiuchi et al. ............... 428/343 |
| 2004/0232543 | A1 | 11/2004 | Goller et al. |
| 2005/0164472 | A1 | 7/2005 | Brod et al. |

FOREIGN PATENT DOCUMENTS

| | | |
|---|---|---|
| DE | 19845847 A1 | 4/2000 |
| DE | 10051938 A1 | 2/2002 |
| DE | 10065686 C2 | 7/2002 |

\* cited by examiner

SEMICONDUCTOR STRUCTURE WITH A PLASTIC HOUSING AND SEPARABLE CARRIER PLATE

CROSS REFERENCE TO RELATED APPLICATIONS

This application is a divisional of U.S. patent application Ser. No. 11/341,895, filed Jan. 30, 2006, entitled "Method for Producing a Semiconductor Component with a Plastic Housing and Carrier Plate for Performing the Method," which is a continuation of PCT/DE2004/001667, filed Jul. 27, 2004, and titled "Method for the Production of a Semiconductor Element with a Plastic Housing and Support Plate for Carrying Out Said Method," which claims priority under 35 U.S.C. §119 to German Application No. DE 10334576.0, filed on Jul. 28, 2003, and titled "Process for Producing a Semiconductor Component Having a Plastic Housing and Carrier Plate for Carrying Out the Process," the entire contents of each of which are hereby incorporated by reference.

FIELD OF THE INVENTION

The invention relates to a method for producing a semiconductor component having a plastic housing and to a carrier plate for performing such a method.

BACKGROUND

Conventional processes for producing certain types of semiconductor components having plastic housings typically involve separating individual semiconductor chips from a common semiconductor wafer. Such semiconductor chips may, for example, have active top surfaces and back surfaces, with the active top surfaces having contact surfaces. Once separated, the semiconductor chips can be mounted on a mold plate. A common carrier is then produced from a plastic embedding compound on the mold plate, and rewiring lines and outer contact surfaces are produced. The common carrier is then divided into the individual semiconductor components.

A process of this type is known, for example, from DE 101 37 184 A1, which describes a process in which the active surface of the singulated semiconductor components is mounted on an adhesive film, which is in turn stretched over a carrier frame. This arrangement is then encapsulated with a synthetic resin, which can be done, for example, using a wafer molding process, a printing process, or similar known processes. The plastic compound is then cured. The film is subsequently pulled off again, and the matrix of semiconductor chips, which have in the meantime been embedded in the common plastic carrier, is removed from the carrier frame. The "reconstituted" semiconductor wafer produced in this way is then used as a starting material for the rewiring processes, as they are known.

The process described above has the fundamental advantages of using very low-cost materials and very efficient process steps. The direct embedding or direct encapsulation of the semiconductor chip with a plastic makes this technology, which is known from the prior art, very versatile, i.e., this technology can be used to process a very wide range of semiconductor chip sizes and to produce a very wide range of housing sizes. It is possible to produce large panels in wafer form which allow further processing using conventional equipment.

However, one major drawback of this known process is that the film material restricts the positional accuracy of the semiconductor chips on the encapsulated wafer. This positional accuracy of the embedded semiconductor chips is adversely affected by various effects. First, the carrier film has only a very limited dimensional stability. Storage, handling and processing of the carrier film cause deformation of the latter. Deformation of this type includes, for example, the formation of creases and relaxation. This formation of creases and relaxation in turn leads to the individual semiconductor chips shifting on the film.

Since the encapsulation process, generally wafer molding, is performed at high temperatures, i.e., at temperatures of up to 180° C., deformation also occurs during that process. The deformation which occurs during the encapsulation process is generally even greater than the deformation of the carrier film caused by storage, handling, and processing of the carrier film. The plastic film generally becomes soft in the temperature ranges above 100° C. up to 180° C. This softening further reduces its stability.

Uniform lamination of the film onto the carrier frame is only achievable with difficulty. An inhomogeneous tension in the film leads to uncontrollable shifts in the semiconductor chips.

Heretofore, there has been no suitable replacement for the films since conversely the film-typical properties of the films are required when separating the chip carrier from the base carrier. Properties which play an important role in this context and are virtually irreplaceable are the delamination ability inherent to a film. A film, unlike more robust carrier materials, can be pulled or peeled off.

If a robust, more stable carrier were to be used as a film replacement, complete separation of the two carriers following the encapsulation process would be very difficult, on account of the excessively high bonding force and the large surface areas. Accordingly, there is a need to provide a new production process and a new carrier that avoids the drawbacks of the films currently in use.

SUMMARY

The present invention provides a process for producing a semiconductor component having a plastic housing in which at least one semiconductor chip is arranged. The process includes: providing a semiconductor wafer having semiconductor chips which are arranged in rows and columns and have active top surfaces and back surfaces, with the active top surfaces being provided with contact surfaces; dividing the semiconductor wafer into individual semiconductor chips; providing a carrier plate having a thermosensitive adhesive on its top surface; mounting the individual semiconductor chips on this carrier plate, wherein the active surfaces of the individual semiconductor chips are placed onto the top surface of the carrier plate; producing a common carrier made from a plastic embedding compound on the carrier plate, with the semiconductor chips being embedded in the plastic embedding compound; and removing the carrier plate by heating the thermosensitive adhesive to a predetermined, defined temperature at which the thermosensitive adhesive loses its adhesive action.

Due to the use of a carrier plate comprising a material that is dimensionally stable in the temperature range from 20° C. to 200° C. and has a low coefficient of thermal expansion, and which is provided with a thermosensitive adhesive on its top surface, it is possible to completely avoid the aforementioned problems of the prior art which are associated with the use of films that are not dimensionally stable.

In this present context and in the text which follows, thermosensitive adhesives are to be understood as meaning an adhesive which has a strongly bonding, i.e., adhesive, action in a defined temperature range, for example has an adhesive action in the temperature range between 20° C. and 90° C. Above 90° C., an adhesive of this type loses its bonding action. Accordingly, the adhesive can be applied to an object, for example at room temperature. The object provided with the adhesive is then processed. After completion of the processing, the adhesive is detached by being heated to a temperature above 90° C. for several minutes so that it loses its adhesive action and can be detached from the processed object without problems.

In one typical configuration of the present invention, the carrier plate comprises a dimensionally stable material which has a coefficient of thermal expansion $\alpha < 10 \cdot 10^{-6}/K$ at room temperature, so that a thermal mismatch with the semiconductor chips on top is avoided.

It is preferable to use materials which additionally have a thermal conductivity $\sigma > 100$ W/mK at room temperature, since the carrier plate is used within a process in which high temperatures and high heat quantities occur. By way of example, metals and their alloys, in particular KOVAR alloys, are conceivable. However, it is also possible to employ copper, copper-beryllium, or other materials known from lead-frame technology.

Another group of suitable materials is represented by the special ceramics from semiconductor technology, in particular aluminum nitride ceramics and aluminum oxide ceramics (corundum ceramics). Initial tests have shown glass and silicon to be particularly suitable materials for the carrier plate. Both materials have a virtually identical coefficient of thermal expansion to the semiconductor chips that are being encapsulated, so that when using these materials thermomechanical mismatches and the associated warping can be minimized.

In one typical embodiment of the present invention, the carrier plate on its top surface has a laminated-on adhesive film, which is provided with a thermosensitive adhesive on its side facing away from the carrier plate and is provided with a permanent adhesive on its side facing the carrier plate.

In another embodiment of the present invention, the carrier plate on its top surface likewise has a laminated-on adhesive film. In this embodiment, however, the abovementioned sides are reversed, i.e., the thermosensitive side of the adhesive film is positioned on the carrier plate, and the permanent adhesive is located on the side facing away from the carrier plate. Under certain circumstances, this can bring the advantage that the film continues to adhere to the reconstituted wafer when the thermosensitive adhesive is heated. It can subsequently be peeled or pulled off the reconstituted wafer separately. This is advantageous if residues of the thermosensitive adhesive on the reconstituted wafer should or must not occur.

Adhesive films or adhesive tapes which have a thermosensitive adhesive on one side and have a permanent adhesive on the other side are available for example under the trade name Revalpha from Nitto. The adhesive films and adhesive tapes available from that company can be used at temperatures up to 180° C.

In one typical embodiment of the process according to the invention, the semiconductor chips are embedded in the plastic embedding compound in such a manner that the back surfaces of the individual semiconductor chips are completely covered with a plastic embedding compound.

However, it is also conceivable for the process to be configured such that the back surfaces of the individual semiconductor chips are not covered with the plastic embedding compound. This brings the advantage of the semiconductor chips being provided with heat sinks on the back surfaces following the first encapsulation step and then completing the encapsulation.

Typically, further process steps are performed after the carrier plate has been detached by heating the thermosensitive adhesive. First, rewiring lines are produced on the top surface of the common carrier. Furthermore, outer contact surfaces are formed. Then, solder balls or solder bumps are applied to the outer contact surfaces. Finally, the common plastic carrier is divided into individual semiconductor components.

The above and still further objects, features and advantages of the present invention will become apparent upon consideration of the following definitions, descriptions and descriptive figures of specific embodiments thereof wherein like reference numerals in the various figures are utilized to designate like components. While these descriptions go into specific details of the invention, it should be understood that variations may and do exist and would be apparent to those skilled in the art based on the descriptions herein.

DETAILED DESCRIPTION

Figure 1A:
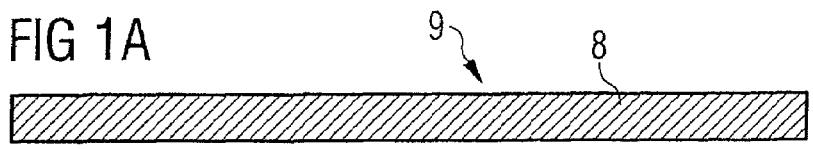
FIGS. 1A to 1F show lateral cross-sectional views of a process sequence used to form a semiconductor component with a plastic housing in accordance with an exemplary embodiment of the present invention.
Figure 1B:
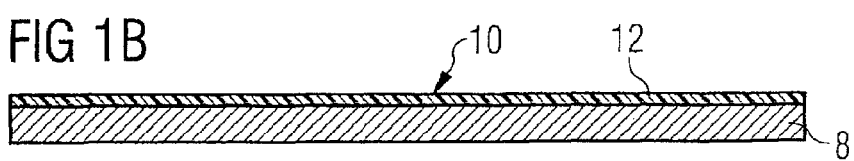

The invention will now be explained in more detail on the basis of an exemplary embodiment and with reference to the accompanying drawings. As can be seen from FIG. 1A, a carrier plate 8, that comprises a dimensionally stable material with a low coefficient of thermal expansion, is provided. For example, the carrier plate 8 shown can comprise silicon. It is, in this case, a relatively thick silicon wafer. As illustrated in FIG. 1B, the carrier plate 8 is then provided with an adhesive film. A double-sided adhesive film 12 is laminated onto the top surface 9 of the carrier plate 8. On its side facing away from the carrier plate 8, the adhesive film 12 has a thermosensitive adhesive 10. On the side of the adhesive film which faces the carrier plate 8, the adhesive film 12 has a permanent adhesive.

Figure 1C:
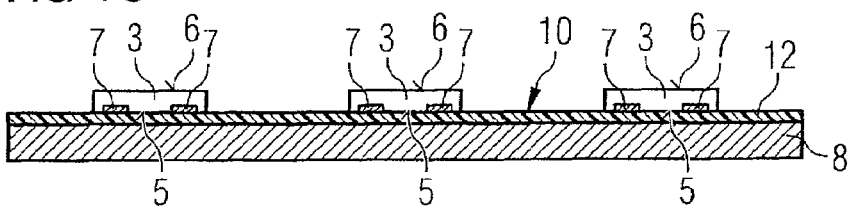

It can be seen from FIG. 1C that semiconductor chips 3 are then mounted on the laminated carrier plate 8. This is preceded by the provision of a fully processed semiconductor wafer 4 which has semiconductor chips 3 arranged in rows and columns. The semiconductor chips 3 have active top surfaces 5 and back surfaces 6. The active top surfaces 5 are provided with contact surfaces 7. The semiconductor wafer 4 is then divided into individual semiconductor chips 3, for example by sawing.

As shown in FIG. 1C, the active top surfaces 5 of the singulated semiconductor chips 3 are placed onto the thermosensitive side of the laminated-on adhesive film 12, so that they are bonded to it.

Figure 1D:
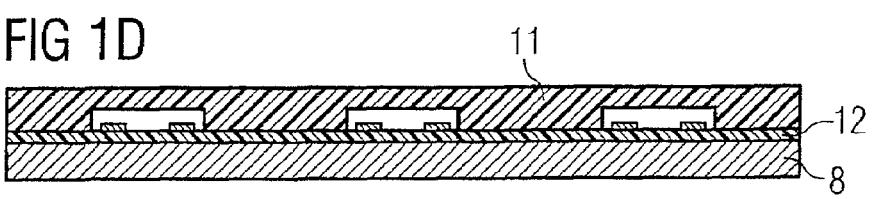

Referring to FIG. 1D, the semiconductor chips 3 are then encapsulated with a plastic embedding compound, so as to form a common carrier 11 made from plastic embedding compound on the carrier plate 8, with the semiconductor chips 3 embedded therein. The encapsulation of the individual semiconductor chips 3 can be performed by wafer molding, by a stencil printing process, by a conventional potting processes, by in-on processes, or by coating processes.

Figure 1E:
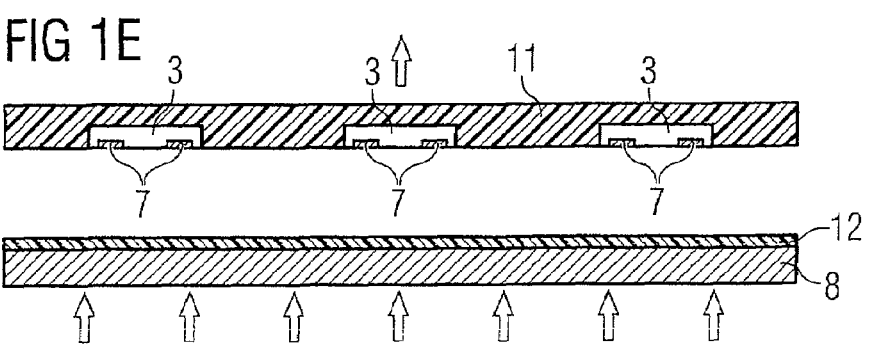

Then, as can be seen from FIG. 1E, the separation of the carrier plate 8 is subsequently separated from the common carrier 11 made from plastic embedding compound. In this operation, the carrier plate 8 is heated to a fixedly defined temperature, so that the side with the thermosensitive adhesive 10 of the laminated-on adhesive film 12 loses its bonding action, and the common carrier 11 made from plastic embedding compound can be released from the carrier plate 8 without difficulty and without the need for any particular force.

Figure 1F:
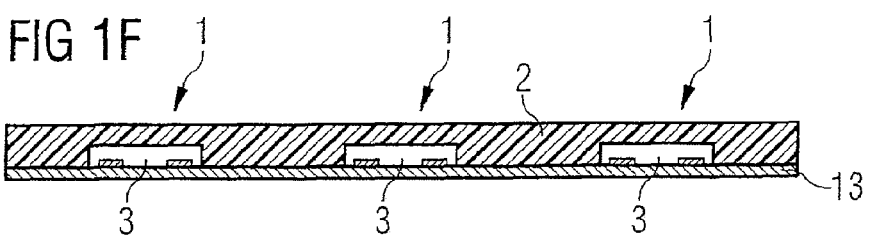

As can be seen from FIG. 1F, further processing follows; namely, the formation of rewiring metallizations 13, of outer contact surfaces (not shown), and the application of solder balls or solder bumps (not shown). Finally, the individual semiconductor components 1 are divided from the common carrier 11.

Having described preferred embodiments of new and improved process for producing a semiconductor component having a plastic housing, it is believed that other modifications, variations and changes will be suggested to those skilled in the art in view of the teachings set forth herein. It is therefore to be understood that all such variations, modifications and changes are believed to fall within the scope of the present invention as defined by the appended claims. Although specific terms are employed herein, they are used in a generic and descriptive sense only and not for purposes of limitation.

What is claimed is:

1. A semiconductor structure, comprising:
   a earner plate;
   a thermosensitive adhesive coupled to a top surface of the carrier plate, the thermosensitive adhesive being removable from the carrier plate at a predetermined, defined temperature at which the thermosensitive adhesive loses its adhesive action;
   a plurality of semiconductor chips having active top surfaces and back surfaces, the active top surfaces including contact surfaces disposed on the thermosensitive adhesive;
   a common carrier comprising a plastic embedding compound on the carrier plate, the semiconductor chips being embedded in the plastic embedding compound; and
   an adhesive film laminated to the top surface of the carrier plate, the adhesive film being provided with the thermosensitive adhesive on a side facing away from the carrier plate and being provided with a permanent adhesive on a side facing the carrier plate.

2. The semiconductor structure of claim 1, wherein the carrier plate comprises a material that is dimensionally stable in a temperature range from 20° C. to 200° C., has a low coefficient of thermal expansion, and is provided with a thermosensitive adhesive on its top surface.

3. The semiconductor structure of claim 2, wherein the dimensionally stable material has a coefficient of thermal expansion $\alpha < 10 \cdot 10^{-6}/K$ at room temperature.

4. The semiconductor structure of claim 2, wherein the dimensionally stable material has a thermal conductivity $\sigma > 100$ W/mK at room temperature.

5. The semiconductor structure of claim 2, wherein the dimensionally stable material provided is a ceramic.

6. The semiconductor structure of claim 2, wherein the dimensionally stable material provided is a metal or an alloy.

7. The semiconductor structure of claim 2, wherein the dimensionally stable material provided is glass or silicon.

8. A semiconductor structure, comprising:
   a carrier plate;
   a thermosensitive adhesive coupled to a top surface of the carrier plate, the thermosensitive adhesive being removable from the carrier plate at a predetermined, defined temperature at which the thermosensitive adhesive loses its adhesive action;
   a plurality of semiconductor chips having active top surfaces and back surfaces, the active top surfaces including contact surfaces disposed on the thermosensitive adhesive;
   a common carrier comprising a plastic embedding compound on the carrier plate, the semiconductor chips being embedded in the plastic embedding compound; and
   an adhesive film laminated to the top surface of the carrier plate, the adhesive film including a permanent adhesive on a side facing away from the carrier plate and including the thermosensitive adhesive on a side facing the carrier plate.

9. The semiconductor structure of claim 8, wherein the thermosensitive adhesive is in direct contact with the top surface of the carrier plate.

10. A semiconductor structure, comprising:
    a earner plate;
    a plurality of semiconductor chips having active top surfaces and back surfaces, the active top surfaces including contact surfaces;
    a common carrier comprising a plastic embedding compound on the carrier plate, the semiconductor chips being embedded in the plastic embedding compound;
    a thermosensitive adhesive disposed between the carrier plate and the plastic embedding compound of the common carrier, wherein the contact surfaces of the semiconductor chips are disposed on the thermosensitive adhesive and the thermosensitive adhesive is removable from the carrier plate at a predetermined, defined temperature at which the thermosensitive adhesive loses its adhesive action; and
    an adhesive film laminated to the top surface of the carrier plate, the adhesive film including a permanent adhesive on a side facing away from the carrier plate and including the thermosensitive adhesive on a side facing the carrier plate.

11. The semiconductor structure of claim 10, wherein the carrier plate comprises a material that is dimensionally stable in a temperature range from 20° C. to 200° C., has a low coefficient of thermal expansion, and is provided with a thermosensitive adhesive on its top surface.

12. The semiconductor structure of claim 11, wherein the dimensionally stable material has a coefficient of thermal expansion $\alpha < 10 \cdot 10^{-6}/K$ at room temperature.

13. The semiconductor structure of claim 11, wherein the dimensionally stable material has a thermal conductivity $\sigma > 100$ W/mK at room temperature.

14. The semiconductor structure of claim 11, wherein the dimensionally stable material provided is a ceramic.

15. The semiconductor structure of claim 11, wherein the dimensionally stable material provided is a metal or an alloy.

16. The semiconductor structure of claim 11, wherein the dimensionally stable material provided is glass or silicon.

17. A semiconductor structure, comprising:
    a carrier plate;
    a plurality of semiconductor chips having active top surfaces and back surfaces, the active top surfaces including contact surfaces;
    a common carrier comprising a plastic embedding compound on the carrier plate, the semiconductor chips being embedded in the plastic embedding compound;
    a thermosensitive adhesive disposed between the carrier plate and the plastic embedding compound of the common carrier, wherein the contact surfaces of the semiconductor chips are disposed on the thermosensitive adhesive and the thermosensitive adhesive is removable from the carrier plate at a predetermined, defined temperature at which the thermosensitive adhesive loses its adhesive action; and an adhesive film laminated to the top surface of the carrier plate, the adhesive film being provided with the thermosensitive adhesive on a side facing away from the carrier plate and being provided with a permanent adhesive on a side facing the carrier plate.

18. The semiconductor structure of claim 10, wherein the thermosensitive adhesive is in direct contact with the top surface of the carrier plate.

* * * * *

UNITED STATES PATENT AND TRADEMARK OFFICE
CERTIFICATE OF CORRECTION

| | |
|---|---|
| PATENT NO. | : 7,622,733 B2 |
| APPLICATION NO. | : 11/685005 |
| DATED | : November 24, 2009 |
| INVENTOR(S) | : Edward Fuergut et al. |

It is certified that error appears in the above-identified patent and that said Letters Patent is hereby corrected as shown below:

Column 5, line 27, replace "a earner plate" with -- a carrier plate --; and

Column 6, line 21, replace "a earner plate" with -- a carrier plate --.

Signed and Sealed this

First Day of June, 2010

David J. Kappos
*Director of the United States Patent and Trademark Office*